United States Patent [19]

Ishiko et al.

[11] Patent Number: 5,732,167

[45] Date of Patent: Mar. 24, 1998

[54] OPTICAL FIBER SENSOR FOR MEASURING A MAGNETIC FIELD OR ELECTRIC CURRENT AND METHOD FOR MAKING THE SAME

[75] Inventors: Daisuke Ishiko, Osaka; Hisashi Minemoto, Ootsu; Nobuki Itoh, Osaka, all of Japan

[73] Assignee: Matsushita Electric Industrial Co., Ltd., Osaka, Japan

[21] Appl. No.: 627,315

[22] Filed: Apr. 3, 1996

[30] Foreign Application Priority Data

Apr. 4, 1995 [JP] Japan ................... 7-078038

[51] Int. Cl.⁶ ......................................... G02B 6/00
[52] U.S. Cl. ................... 385/12; 385/4; 385/6; 385/1; 385/9; 324/244.1
[58] Field of Search ................... 385/12, 4, 6, 34, 385/1, 11; 324/244, 244.1, 260, 96; 250/225, 227.17

[56] References Cited

U.S. PATENT DOCUMENTS 4,962,990 10/1990 Matsuzawa et al. ............ 385/34 X
5,202,629 4/1993 Seike et al. .................... 324/244.1

FOREIGN PATENT DOCUMENTS 63-60410   3/1988  Japan.
1308970   12/1989  Japan.
363606     3/1991  Japan.
3170071    7/1991  Japan.
5297027   11/1993  Japan.

OTHER PUBLICATIONS

"Fiber –Optic Monitoring Sensor System for Power Distribution Lines" by D. Ishiko et al, National Technical Report vol. 38, No. 2, pp. 255–261 (1992) Apr.

"Submicroampere–per–root–hertz current sensor based on the Faraday effect in Ga:YIG" by A.H. Rose, et al, Optics Letters Vo. 18, No. 17, pp. 1471–1473 (1993) Apr.

"Polarization–Independent In–Line Optical Insolator with Lens–Free Configuration" by Shiraishi et al, Journal of Lightwave Technology, vol. 10, No. 12, pp. 1839–1842 (1992) No Month.

Primary Examiner—Phan T. H. Palmer
Attorney, Agent, or Firm—Lowe, Price, LeBlanc & Becker

[57] ABSTRACT

An optical fiber sensor which is adapted for use in combination with a horseshoe-type iron core comprises a substrate having a groove pattern established by a pair of elongated spaced, parallel grooves, and a third groove which intersects the paired grooves at right angles. An optical fiber having a U-shaped portion is inserted into and fixed in the groove pattern, and an optical modulation unit, which is fixedly provided in a light path of the optical fiber, is placed in the third groove. The substrate is a composite which comprises a non-magnetic portion and soft magnetic portions fixed to either side of the non-magnetic portion. The paired elongated grooves are formed in the soft magnetic portions, while the optical modulation unit is fixed to the non-magnetic portion. A method for making such a composite substrate is also described.

21 Claims, 7 Drawing Sheets

OPTICAL FIBER SENSOR FOR MEASURING A MAGNETIC FIELD OR ELECTRIC CURRENT AND METHOD FOR MAKING THE SAME

BACKGROUND OF THE INVENTION

1. Field of the Invention

This invention relates to an optical fiber sensor which is adapted for the measurement of a magnetic field or electric current by using light beams. The invention also relates to a method for making an optical fiber sensor of the type mentioned above.

2. Description of the Prior Art

As optical element-making techniques, optical measuring techniques and optical communication techniques have been recently advanced, optical sensors and miniaturized optical devices for optical communication systems have been put into practice in various fields, or are under study or investigation for practical usage. For instance, optical fiber sensors have not only good insulating properties, but also good characteristics such as a high resistance to electromagnetic inductive noises resulting, for example, from thunder. Accordingly, such sensors are being reduced to practice as optical fiber current or voltage sensors in the field of the electric power (National Technical Report Vol. 38, No. 2, pp. 255–261 (1992), A. H. Rosee et al; Optics Letters, Vol. 18, No. 17, pp. 1471–1473 (1993); and U.S. Pat. No. 5,202,629). Further, optical integrated circuits have been proposed in which optical waveguides are formed in a substrate and different types of optical elements are disposed in the waveguides as set out, for example, in Japanese Laid-open Patent Application No. 6360410. Optical parts or devices for optical communication have also been proposed in which an optical fiber is embedded in grooves of a substrate, and other grooves are separately formed in position by means of a rotating blade saw in which optical elements are inserted, respectively (K. Shiraishi et al; J. Lightwave Tech. Vol. 10, No. 12, pp. 1839–1842 (1992); and Japanese Laid-open Patent Application No. 363606). Recently, a line-assembled optical fiber sensor using a thin film polarizer has been proposed for the purposes of miniaturization of the optical fiber sensor and also of providing lenseless assemblings.

Figure 9:
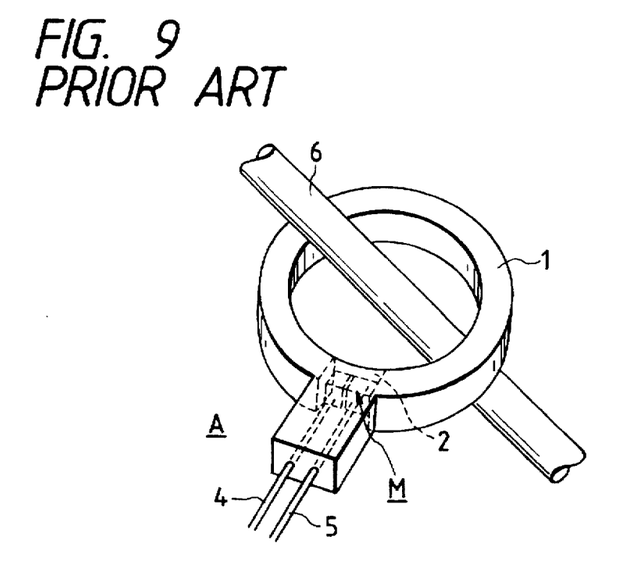
FIG. 9 is a schematic perspective view showing application of an known optical fiber sensor to detection of an electric current using a horseshoe-type grain oriented silicon steel core.

The measurement of an electric current passing through an electric wire is shown in FIG. 9. In the figure, an optical current sensor including conventional optical components is shown. An optical fiber magnetic field sensor is disposed at a gap 2 of a horseshoe-type iron core 1 for use as an optical fiber current sensor.

More particularly, the sensor includes a beam input side optical fiber 4, an optical modulation unit $\underline{M}$ including a polarizer, a magnetooptical crystal, an analyzer and a reflector (all not shown) and a beam output side optical fiber 5 arranged as shown in the figure. A light beam from a light source (not shown) is transmitted from the optical fiber 4 na the optical modulation unit $\underline{M}$ to the optical fiber 6. At the center of the horseshoe-type iron core 1, an electric wire 6 is passed through. The passage of an electric current through the electric wire 6 permits a magnetic field to be generated at the gap 2 of the iron core 1 in proportion to the current to be measured. By this, the magnetooptical crystal of the optical modulation unit $\underline{M}$ inserted into the gap 2 modulates the light being transmitted in proportion to the magnitude of the electric current.

Figure 10:
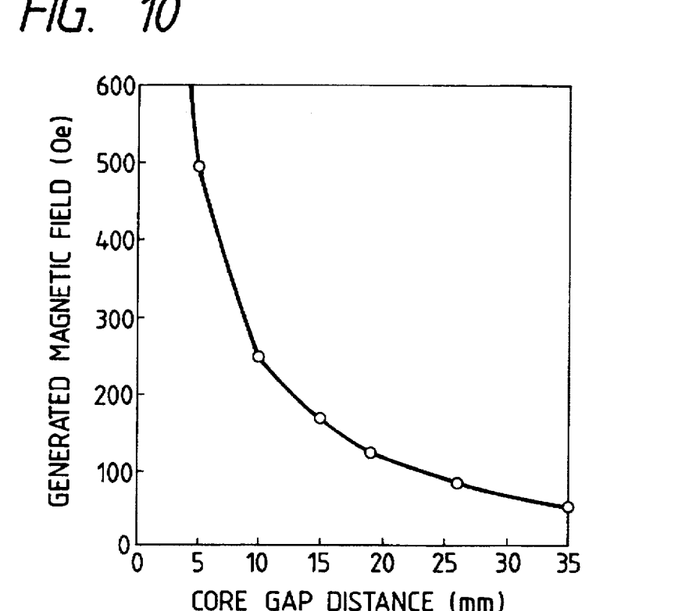
FIG. 10 is a graph showing the relation between the magnetic field generated in a gap of the core shown in FIG. 9 and the gap distance of the grain oriented silicon steel core.

FIG. 10 shows the relation between the generated magnetic field (Oe) at the gap 2 and the gap distance in mm of the iron core 1 for an applied current of 200 A. While the gap is changed from 6 to 35 mm, the intensity of the magnetic field generated at the gap is measured. The horseshoe-type core is made of a grain-oriented silicon steel. The electric wire is disposed at the center of the core 1 and applied with a current of 200 A. From the figure, it will be seen that the intensity of the magnetic field generated in the gap becomes lower at a greater gap distance. In order to set existing optical sensors in position, the gap distance of the steel core should be approximately 20 mm or above. If this distance can be shortened to about 10 mm, the current detection sensitivity increases to about two times greater than that of the case using the distance of 20 mm. Likewise, if it is possible to shorten the distance to about 5 mm, one is enabled to improve the sensitivity by about 4 times greater.

Figure 11:
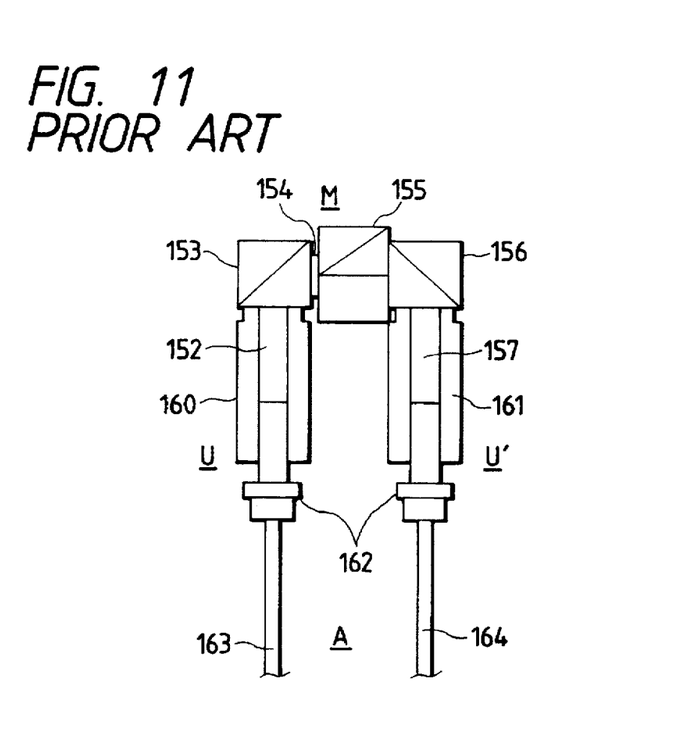
FIG. 11 is a schematic plan view showing a known optical fiber sensor using prior art optical components.

FIG. 11 typically shows an arrangement of a prior art optical fiber magnetic field sensor of the type being set in the gap 2 of the iron core 1 shown in FIG. 9. The sensor includes an optical modulation unit which includes a polarizer 153, a magnetooptical element 154 made, for example, of a garnet crystal, an analyzer 155 and a total reflection mirror 156 sequentially arranged in this order. The polarizer 153 is connected to an input side optical fiber 163 via a collimating unit having a rod lens 152 and a ferrule 162. A holder 160 is to hold the lens 152 in position. Likewise, the total reflection mirror 156 is connected to an output side optical fiber 164 via a collimating unit $\underline{U}$ including a rod lens 167 and a ferrule 162.

In this arrangement, a light beam from the optical fiber 163 is passed through the collimating unit $\underline{U}$, the optical modulation unit $\underline{M}$, and the collimating unit $\underline{U}'$ to the optical fiber 164. When a magnetic field is applied to the magnetooptical element 154, the light beam being passed therethrough is modulated proportionally to the intensity of the magnetic field as is known in the art.

In practice, these optical parts or components including the optical fiber 163, lens 152, polarizer 153, magnetooptical element 154, analyzer 155, mirror 156 and lens 157 are assembled and individually fixed by means of a bonding agent while exactly adjusting the optical axes thereof.

This type of sensor has the following problems. A number of expensive optical components and much time are required for assembling one optical fiber sensor, resulting in a high fabrication cost. The polarizer 153, analyzer 155 and total reflection mirror 156 have, respectively, a size of about 5 mm square, thus impeding the fabrication of a sensor which is small in size and thin. Although optical components having a size not greater than 5 mm square may be commercially available, such parts are very expensive and cannot withstand practical use.

The prior sensor will be improved in sensitivity if the core is made of a material having high permeability and a high saturation magnetic flux density or if the magnetooptical element is made of a crystal material whose sensitivity is significantly improved or if the gap distance of the horseshoe-type iron core is made narrower to prevent a leakage flux at the gap portion thereby increasing the intensity of magnetic field thereat. For the developments of such iron core materials and magneto-optical materials, much cost and time are essential.

In contrast, the improvement of the sensitivity by reducing the gap distance of the iron core or by hanging the shape of the gap portion might be attained in an easier way. However, for the measurement of a magnetic field or an electric current by utilizing light beams, it is essential to insert the optical modulation unit including $\underline{M}$ the magnetooptical element and other optical components into the gap as having been set out with reference to FIG. 9. Thus, limitation is placed on the reduction in size of the gap portion. The optical modulation unit is located in the optical path of the optical fiber, and individual optical components are so fragile that it is necessary to relatively loosely insert the optical modulation unit into the gap portion. Accordingly, the gap distance of the core depends solely on the sizes of the optical components.

In order to attain high sensitivity, the optical modulation unit should be made so small in size that the horseshoe-type iron core can be designed to have a narrow gap distance. Nevertheless, in view of the fact that the elongated electric wire has to be set in position at the center of the iron core, it is beneficial that the gap distance of the core be greater than the diameter of the electric wire. To this end, it will be necessary to arrange the core such that its gap distance is great enough to permit easy insertion of the electric wire, but the gap is designed to be magnetically narrow. In order to realize this arrangement and to improve the sensitivity, Japanese Laid-open Patent Application No. 1308970 sets out a problem to be solved. More particularly, such a problem includes how to prevent leakage of a magnetic flux from the gap portion by forming a path of the magnetic flux in the gap portion, thereby increasing the intensity of a magnetic field to be applied to the optical modulation unit.

Japanese Laid-open Patent Application No. 5-297027 sets forth a technique for improving sensitivity without changing the distance in the gap of a horseshoe-type iron core. More particularly, a magnetic piece and a magnetic field detector element are integrally combined through an insulating material. This integrally combined piece inserted into the gap of the horseshoe-type iron core as a spacer for preventing a change of the gap distance in the gap portion of the iron core. In the spacer arrangement, the magnetic piece is in contact with one end portion of the iron or steel core.

Japanese Laid-open Patent Application No. 3-170071 sets out a method wherein a field-sensitive element is inserted into the gap of a horseshoe-type iron core. Separately, iron core pieces which are made of a material different from that of the horseshoe-type iron core are also inserted into the gap. Thus, two types of iron core materials are connected in series to improve current detection characteristics. The purpose in this publication is to improve the hysteresis characteristics of the iron core material, without positively reducing the gap distance of the horseshoe-type iron core. In this method, the type of horseshoe-type iron core and the type of iron core pieces being inserted into the gap portion are properly selected depending on the magnitude of a current to be measured.

SUMMARY OF THE INVENTION

It is an object of the invention to provide an optical fiber current or magnetic field sensor which includes an optical modulation unit and optical fibers connected thereto without use of any lenses and/or ferrules, so that the sensor can be made smaller in size than in prior art counterparts.

It is another object of the invention to provide an optical fiber current or magnetic field sensor which can realize a narrow gap distance in its application to a horseshoe-type iron core.

It is a further object of the invention to provide an optical fiber sensor which is small in size, simple in construction and low in cost.

It is a still further object of the invention to provide a method for making an optical fiber sensor wherein a substrate is made of a non-magnetic material portion and soft magnetic material portions provided at opposite side of the first-mentioned portion and fixed to the non-magnetic portion.

According to a broad aspect of the invention, there is provided an optical fiber current or magnetic field sensor which comprises:

a substrate having a pair of elongated grooves separated from and in parallel with each other and formed along the length of the substrate, and a third groove intersected at right angles by the paired grooves, respectively;

an optical fiber having a U-shaped portion which is inserted into and forced in a groove pattern formed by the paired grooves and the third groove; and an optical modulation unit which is fixedly provided in a light path of the optical fiber placed in the third groove, wherein the substrate is composed of a composite substrate which composes a non-magnetic sheet portion and soft magnetic portions fixed to the non-magnetic sheet portion at opposite sides thereof, and the optical modulation unit is fixed to the non-magnetic sheet portion.

Preferably, the U-shaped portion inserted in the groove pattern is made of a bare optical fiber.

It will be noted that the term "bare optical fiber" is intended to mean an optical fiber consisting of a core and a cladding layer but is free of any jacket and a buffering layer although a surface treating agent may be deposited on the cladding layers and used to permit intimate contact between the cladding layer and the buffer layer.

In a preferred embodiment of the invention, the substrate is made of a glass or ceramic portion and soft magnetic portions made of a soft magnetic material and bonded to the glass or ceramic portion at opposite sides thereof wherein the paired grooves are formed in the respective soft magnetic portions and the optical modulation unit is disposed at the glass or ceramic portion.

In accordance with another preferred embodiment of the invention, a soft magnetic piece is mounted on at least one of the soft magnetic portions to increase an area of a side of the sensor which is facing the end face of a horseshoe-type iron core upon insertion of the sensor into a gap of the iron core.

According to a further embodiment of the invention, there is also provided a method for making an optical fiber current or magnetic field sensor which comprises a substrate having a non-magnetic portion made of a non-magnetic material and soft magnetic portions made of a soft magnetic material and bonded at opposite sides of the non-magnetic portion, the substrate having a pair of grooves separated from and in parallel with each other and formed along the length of the substrate, and a third groove intersected at right angles by the paired grooves, respectively; an optical fiber having a U-shaped portion fixed in a groove pattern formed by the paired grooves and the third groove; and an optical modulation unit which is fixedly provided in a light path of the optical fiber placed in the third groove, wherein the substrate is formed by bonding the soft magnetic portions to the non-magnetic portion at opposite sides thereof by means of a bonding agent. Alternatively, the soft magnetic portions may be integrally combined with the nonmagnetic portion by applying an inorganic bonding agent, such as a low melting glass bonding agent, between the soft magnetic portions and the non-magnetic portion and firing the applied bonding agent.

In the method, it is preferred that the non-magnetic portion is made of a glass or ceramic material and has a thickness equal to or smaller than the soft magnetic portions.

PREFERRED EMBODIMENTS OF THE INVENTION

Figure 1:
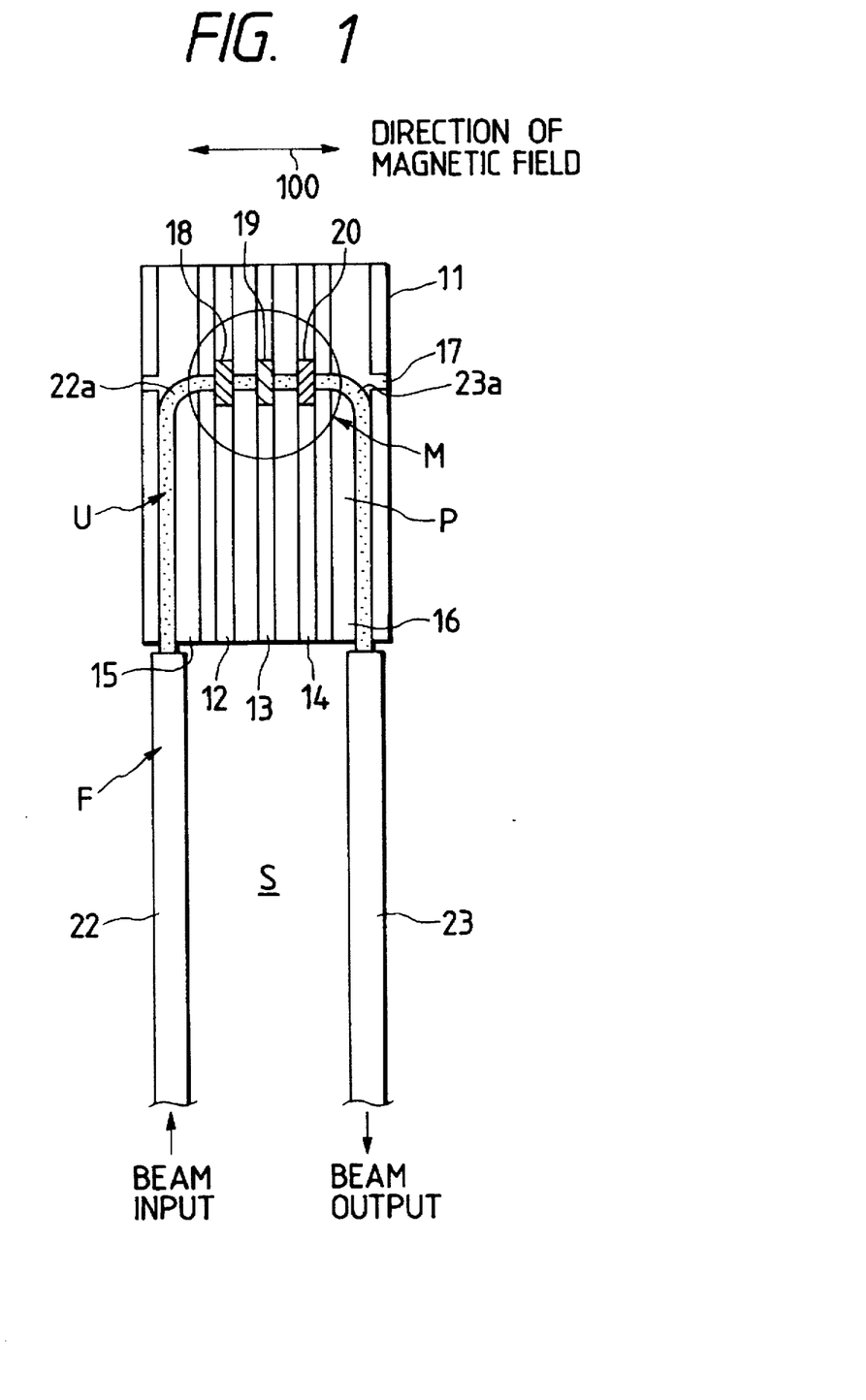
FIG 1. is a schematic plan view of an optical fiber sensor only for illustrating a fundamental concept of the invention.

Reference is now made to the accompanying drawings and particularly to FIG. 1. In FIGS. 1 to 8, like reference numerals indicate like parts or members, respectively.

FIG. 1 shows a fundamental arrangement of an optical fiber sensor for illustrating the general concept of the invention. It should be noted that the fundamental arrangement shown in this figure is applicable to the embodiments of the invention except that the substrate used differs from those used in the embodiments of the invention as will be described hereinafter. This type of sensor is set out, for example, in U.S. patent application Ser. No. 08/497,353 or a corresponding European Patent Application No. 9,511, 0251.6.

The sensor is generally indicated by 6, which includes a substrate which is entirely made of glass. The substrate 11 has a pair of relatively wide grooves 15, 16 formed along the length thereof and a groove 17 which intersects with the paired grooves 15, 16 at right angles, respectively, thereby forming a groove pattern capable of receiving a U-shaped pattern of an optical fiber as will be set out hereinafter. The paired grooves 15, 16 are kept away from and in parallel to each other as shown. The substrate has further grooves 12, 13 and 14 formed in parallel to the paired grooves 15, 16.

An optical fiber F has a U-shaped portion U and extensions 22, 23 from the free ends of the U-shaped portion U. The U-shaped portion U, inverted as viewed in the figure, of the optical fiber F is inserted into and fixed in the groove pattern P formed by the paired grooves 15, 16 and the groove 17. The U-shaped portion U has two bent portions 22a and 23a, respectively. The two bent portions are so formed as having a small radius of curvature. The bottom portion of the U shape is linear as received in the groove 17. The transmission loss of a light beam passing through the optical fiber F varies depending on the curvature at the bent portions 22a, 23a. More particularly, a greater radius of curvature results in a smaller loss and a smaller radius of curvature results in a greater loss. If, however, the curvature is made great, it is inevitable that the width of the sensor as a whole be much greater. This requires a corresponding large gap distance of an horseshoe-type iron core to which the sensor is applied.

The optical fiber F includes extensions 22, 23 and the bare or exposed fiber portion U in the U form made of a core and a clad layer with or without a surface treating agent on the clad layer. The extensions 22, 23 may be entirely composed of a jacketed optical fiber. Alternatively, a bare optical fiber may be used for the respective extensions. The optical fiber used may be any type of fiber known in the art and includes, for example, multi-component optical fibers, plastic optical fibers, silica optical fibers, and the like.

An optical modulation unit M is placed in the optical path of the 5 optical fiber F along the groove 17 of the substrate 11.

The optical modulation unit M includes a polarizer 18, a magneto optical element 19 and an analyzer 20. In this figure, the polarizer 18, magnetooptical element 19 and analyzer 20 are, respectively, inserted into the grooves 12, 13 and 14 from which the optical fiber has been removed. By this, the optical modulation unit M is provided in the optical path. The polarizer 18 and the analyzer 20 are, respectively, made of a thin glass polarizing sheet, which is commercially available, for example from Corning Inc. of United States under the designation of Polarcor. The magnetooptical element 19 is made, for example of a garnet crystal. The garnet single crystal used as the element 19 is formed, for example, by epitaxially growing a Bi-substituted garnet film of the formula, $(BiYGdLa)_3(FeGa)_5O_{12}$ on a substrate made, for example, of $(GdCa)_3(MgZrGa)_5O_{12}$. As a matter of course, other types of crystals such as $(BiYGd)_3Fe_5O_{12}$, $(TbY)_3Fe_5O_{12}$ and the like may also be used for this purpose.

The fabrication of the sensor of the type having set out hereinabove is described.

First, the glass substrate is provided with a thickness of about 1 to 3 mm. The substrate is formed with the paired grooves 15, 16 and the groove 17 according to any known procedures including the use of a rotating blade saw, sand blasting, molding techniques and the like. It is preferred in view of the grooving accuracy, processing speed and worldling properties to use a rotating blade saw. The use of the rotating blade saw is very advantageous from the standpoint of mass productivity.

Separately, an optical fiber is provided with bare or exposed portion by removing a jacket therefrom. Then, the optical fiber is bent at a desired bending angle by use of a blower with an electric resistance heater. Preferably, the bent portions 22a, 23a are formed so as to have a predetermined bending radius in view of the optical loss and the size of the sensor. The thus shaped optical fiber E is fixed to a groove pattern found by the grooves 15, 16 and 17 by using a bonding agent such as a thermosetting epoxy resin. It should be noted that at least the grooves 15, 16 are formed wide enough to be sufficient to accommodate the bent portions 22a, 23a therein.

Thereafter, the grooves 12, 13 and 14 are found, for example, by use of a rotating blade saw, to interact at right angles with the groove 17. During the formation, the bonded optical fiber is scraped off at the grooves 12, 13 and 14. The grooves 12, 13 and 14 should have, respectively, widths which are slightly greater than the widths of the polarizer 18, magnetooptical element 19 and analyzer 20 to be inserted thereinto.

In this arrangement, when an electric current is passed through an electric wire in a manner shown in FIG. 9, the magnetic field is generated in the direction shown by reference numeral 100.

If the bare optical fiber in the U form has a size greater than the grooves 15, 16 and 17, the fiber is not inserted thereinto. On the other hand, when the optical fiber of the U-shaped portion is much smaller in size than the grooves 15, 16 and 17, a greater amount of bonding agent becomes necessary. This is not advantageous in that after insertion and bonding of the optical modulation unit, the optical axes of individual optical elements may be varied owing to a change in temperature. In general, if the bare optical fiber has a diameter of 230 the groove 17 is formed using a blade having a width of approximately 250 µm. It will be noted that the groove width formed by means of the rotating blade saw usually becomes slightly greater than a thickness of the blade used. The grooves 15, 16 are found as having a width sufficient to receive the bent portions 22a, 23a, and the width is generally in the range of 0.5 to 3 mm.

Subsequently, the individual optical elements 18, 19 and 20 are, respectively, inserted into and fixed in the grooves 12, 13 and 14 thereby forming the magnetooptical modulation unit N. The grooves 12, 13 and 14 are formed as having, respectively, a width, for example, of 0.2 to 0.5 mm. This is because the thicknesses of the thin glass polarizer 18 and analyzer 20 are, respectively, in the range of from 0.2 to 0.5 mm and the garnet crystal used as the magnetooptical element 19 is, for example, one obtained by liquid phase epitaxy and has a thickness of about 0.5 mm.

In this arrangement, the sensor can be made smaller in size since lenses and/or ferrules as used in the sensor of FIG. 11 are unnecessary. In addition, the optical elements or parts are inserted into the grooves and fixed, so that it is unnecessary to adjust the optical axes of the elements. A misalignment in optical axes of the elements can be caused in conventional sensors by inclination of the elements, and adjustment of the elements takes a very long time. In the sensor according to the present invention, the problem on the adjustment is completely overcome.

The size in cross-section of the optical elements for transmitting a beam should be slightly greater than the diameter of the optical fiber, and is generally in the range of 0.5 to 2.0 mm. Thus, the miniaturization of the sensor can be realized.

Nevertheless, if the substrate which is entirely made of glass or other non-magnetic material has a width of 20 mm, it becomes necessary to make a gap distance of a horseshoe-type iron core at approximately 26 mm while taking into account a margin for module casing. In this case, the region where the optical modulation unit including the polarizer, magnetooptical element and analyzer is set has a width of about 10 mm, with the balance being for the regions occupied by the bent portions of the optical fiber. This is not advantageous from the standpoint of the sensor sensitivity as previously discussed with reference to FIG. 10.

Figure 2:
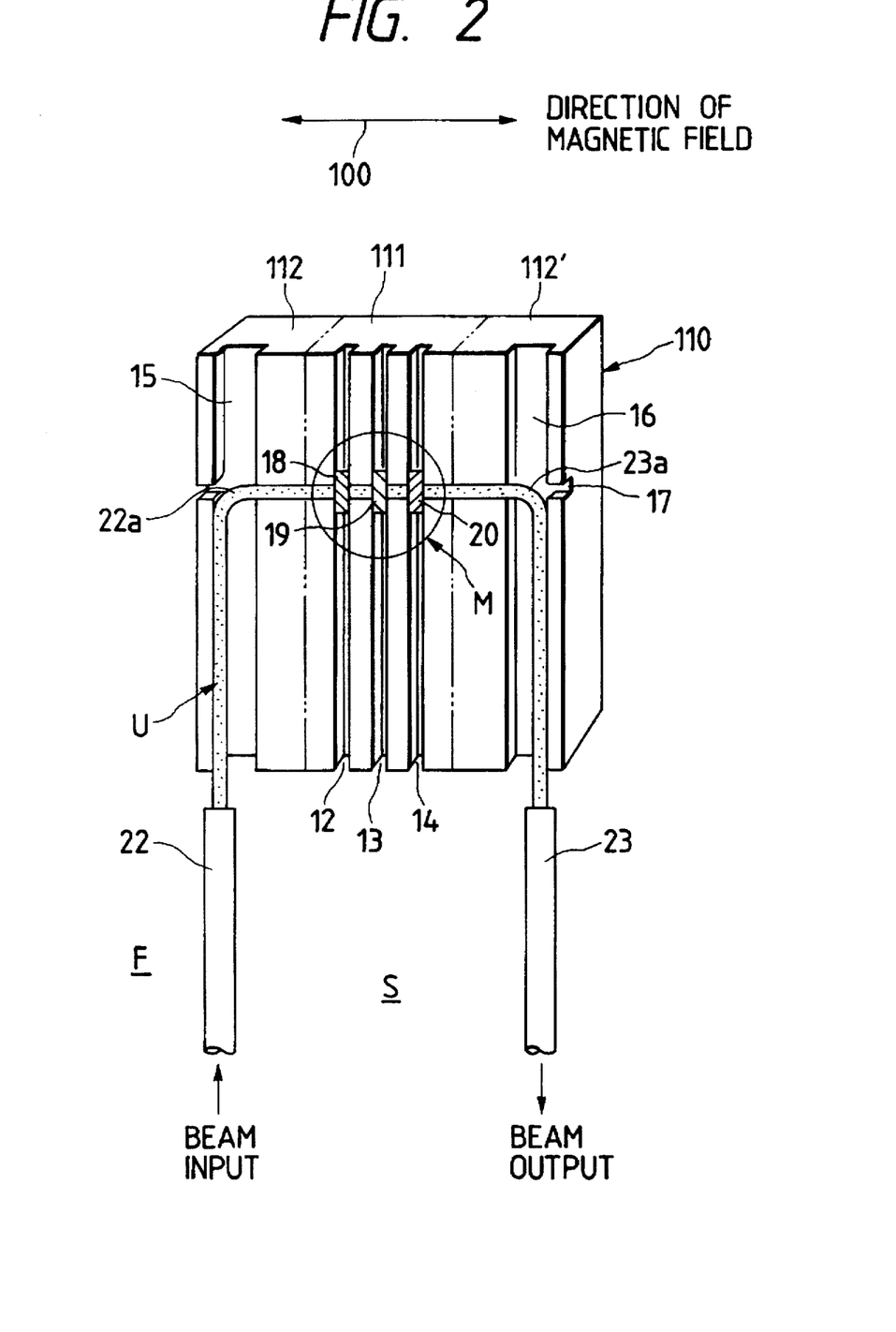
FIG. 2 is a schematic perspective view of an optical fiber sensor according to one embodiment of the invention.

FIG. 2 shows an improved optical fiber sensor according to one embodiment of the invention. In the embodiment, a substrate 110 is different from the substrate 11 of FIG. 1 and is a composite substrate. The composite substrate 110 is made of two types of materials. More particularly, the composite substrate 110 includes a non-magnetic portion 111 and two soft magnetic portions 112, 112' made of a soft magnetic material such as a ferrite and bonded to the non-magnetic portion 111 at opposite sides thereof as shown in FIG. 2. The non-magnetic portion has three longitudinal grooves 12, 13, 14 extending along the length thereof. The two portions 112, 112', respectively, have longitudinal grooves 15, 16 which are wider than the grooves 12, 13 and 14. The transverse groove 17 is formed to interact with the grooves 15, 16 at substantially right angles.

Owing to the presence of the soft magnetic portions 112, 112' at opposite sides of the composite substrate 110, the effective gap distance in a horseshoe-type iron core can be reduced as previously discussed herein.

The non-magnetic materials for the portion 111 include, for example, glass and ceramics made, for example, of $SiO_2$, $Al_2O_3$ and the like, and synthetic resins such as glass-epoxy materials, phenolic resins and the like. In view of the ease in processability and the processing accuracy, glass or ceramic material is preferred.

The optical modulation unit M is disposed in the non-magnetic portion 111. More particularly, at the intersections of the longitudinal grooves 12, 13 and 14 and the transverse groove 17. The polarizer 18 is inserted into the groove 12, the magnetooptical element 19 is inserted into the groove 13, and the analyzer 20 is inserted into the groove 14. These optical elements 18, 19 and 20 are forced to the respective grooves by means of a bonding agent.

The sensor of this embodiment can be fabricated substantially in the same manner as set out with reference to FIG. 1 except that the composite substrate 110 is made in the following manner.

The non-magnetic sheet portion 111 is bonded with the soft magnetic portions 112, 112' at opposite sides thereof by means of an organic bonding agent such as an epoxy resin. Alternatively, an inorganic bonding agent such as low melting glass may be used for the bonding, followed by firing at a temperature ranging from 400° to 650° C. to integrally bond the non-magnetic and magnetic portions together.

The composite substrate 110 generally has a thickness sufficient to fixedly hold the U-shaped bare optical fiber U in the grooves 15, 16 and 17. In view of the ease in handling and the yield which may be reduced by breakage, the thickness of the substrate is preferably 1 mm or over.

For the efficient fabrication of the composite substrate 110, it is convenient to bond an elongated non-magnetic sheet 111 and elongated soft magnetic portions 112, 112' together in a manner as having set out hereinabove to obtain an elongated composite material. This elongated material is cut into pieces, each serving as the composite substrate 110 with a desired length. In this case, good productivity is attained when the longitudinal grooves 15, 16 and the transverse grooves 17 have been formed in the elongated composite material prior to the cutting. Needless to say, it is not always necessary to bond the non-magnetic portion 111 and the soft magnetic portions 112, 112' so as to be exactly level at end faces thereof In other words, these portions may be bonded so as to be slightly stepped with each other.

The soft magnetic materials used for the portions or sheets 112, 112' may be ferrites such as Mn—Zn ferrite, Ni—Zn ferrite and the like, or silicon steels. Of these, the ferrites are preferred although this will depend on the type of horseshoe-type core material.

When the sensor is inserted into a gap of a horseshoe-type iron core, the effective gap distance can be reduced by the presence of the soft magnetic portions 112, 112'. In addition, the bent portions 22a and 23a of the optical fiber F are, respectively, disposed in the grooves 15 and 16 of the soft magnetic portions 112, 112'. Accordingly, the bent portions 22a, 24a may be bent at a greater radius of curvature, thereby reducing beam transmission loss without any increase in the effective gap distance. This is advantageous in that even if the horseshoe-type iron core is designed to have a large gap distance to sufficiently check an electric current of an electric wire having a relatively great diameter, the effective gap distance becomes far smaller than the actual designed gap distance. Accordingly, this optical fiber sensor exhibits higher sensitivity than in the case of a sensor using a substrate entirely made of glass or the like non-magnetic materials. The sensor is especially effective in checking an electric current passing through or a magnetic field generated around relatively thick electric wires.

Preferably, the radius of curvature at the bent portions 22a, 23a is in the range of 0.3 to 5 mm. If the bending radius of curvature is smaller than 0.3 mm, the optical loss exceeds 5 dB. In addition, it is difficult to consistently bend the bare optical fiber portion at a smaller radius.

The optical fiber sensor using the composite substrate is negatively influenced by only a reduced external magnetic field, and thus, has high sensitivity.

Figure 3:
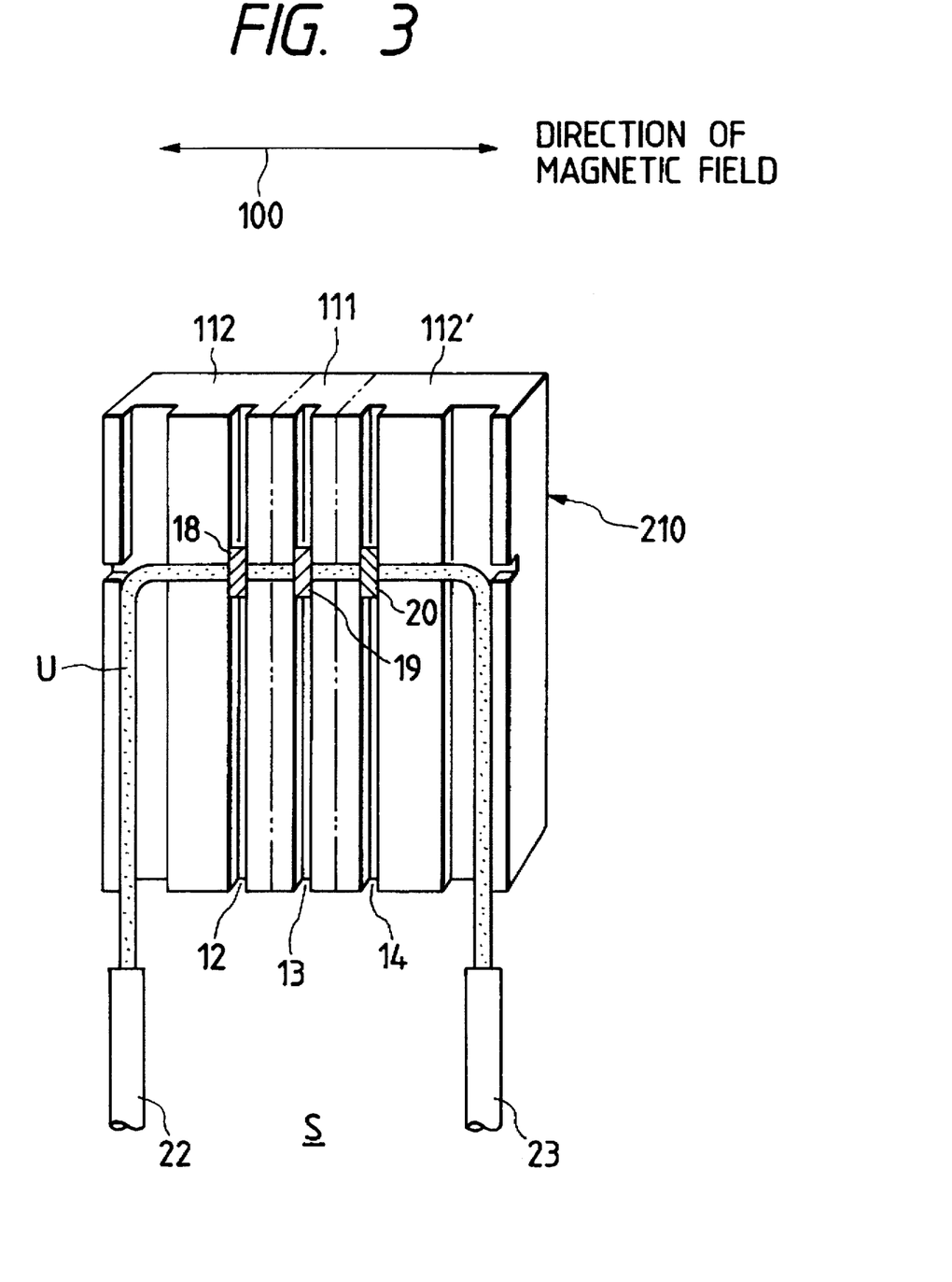
FIG. 3 is a schematic perspective view of an optical fiber sensor according to another embodiment of the invention.

FIG. 3 shows another embodiment of the invention. This embodiment differs from the embodiment shown in FIG. 2 in that a composite substrate 210 includes a non-magnetic portion 111 bonded with soft magnetic portions 112, 112' at opposite sides, like the 20 composite substrate 110 of the first embodiment, but the non-magnetic portion 111 is so small in width as to form only one groove for insertion of the garnet or other magnetooptical crystal element 19 alone.

The polarizer 18 and the analyzer are, respectively, inserted into and fixed in the grooves 12, 14 formed in the soft magnetic portions 112, 112' provided at opposite sides of the non-magnetic portion 111.

The non-magnetic portion 111 is of sufficient width so as to be slightly wider than a thickness of the magnetooptical element 19.

A number of magnetooptical materials are known in the art, of which a garnet crystal formed by liquid phase epitaxy as described hereinbefore is the thinnest and exhibits the highest sensitivity. The garnet crystal including a substrate for the epitaxy has a thickness as small as about 0.5 mm. Taking into account the thickness of the garnet crystal 19 and a processing margin for the longitudinal groove 13, it is possible that the non-magnetic portion 111 sandwiched between the soft magnetic portions 112, 112' is set at a thickness of about 2 mm. This means that the distance between the soft magnetic portions 112, 112' can be brought close to about 2 mm.

When the sensor of this embodiment is inserted into the gap of a horseshoe-type iron core, the intensity of a magnetic field generated in the gap of the iron core can be detected to a much greater extent than in prior art counterparts, with enhanced prevention of leakage of the magnetic flux. This leads to a small flux leakage loss at the gap of the iron core, with the result that it is possible to detect, a magnetic field from a very weak current passing through an electric wire placed substantially at the center of the iron core. This arrangement ensures a gap distance which is smaller than that shown in FIG. 2.

In the foregoing embodiments, if the composite substrates 111 are too thin, a magnetic field generated at the gap of a horseshoe-type iron core may not be satisfactorily detected due to the leakage thereof. In order to increase the intensity of the magnetic field to be detected, it is preferred to use soft magnetic portions which are thick enough to prevent the leakage of the flux. In this case, the soft magnetic portions and the non-magnetic portion may differ in thickness provided that the soft magnetic portions are thicker than the non-magnetic portion.

This is particularly described with reference to FIGS. 4 to 6 to illustrate the use of thick soft magnetic portions.

Figure 4:
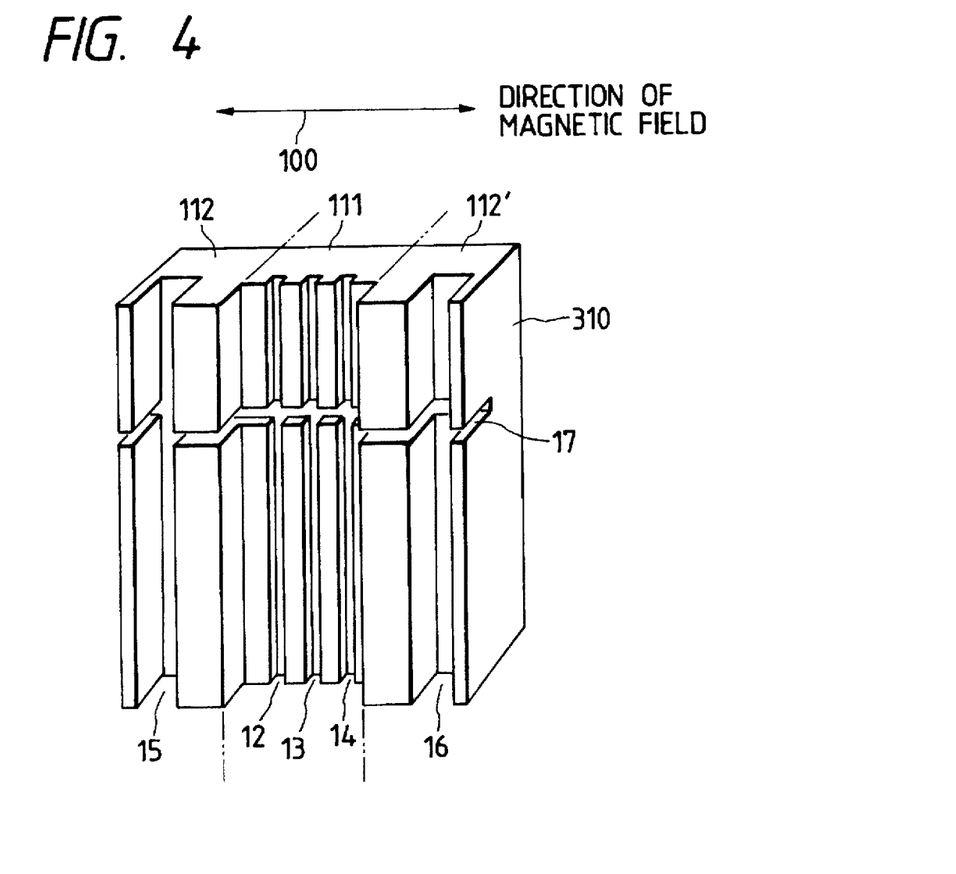
FIG. 4 is a schematic perspective view of an optical fiber sensor according to a further embodiment of the invention.

FIG. 4 shows an optical fiber sensor according to a further embodiment of the invention wherein a composite substrate 310 includes a non-magnetic portion 111 and soft magnetic portions 112, 112' bonded to the non-magnetic portion 111 at opposite sides thereof in a manner similar to the foregoing embodiments. In this embodiment, the longitudinal grooves 12, 13 and 14 are formed in the non-magnetic portion 111 although only one groove 13 may be formed in the sheet 111 as is particularly shown in FIG. 3.

The soft magnetic portions 112, 112' are each thicker than the nonmagnetic portion 111 sandwiched therebetween. In order to prevent the flux leakage to a satisfactory extent, the soft magnetic portions 112, 112' should preferably have a thickness ranging from 10 to 30 mm, which may vary depending on the area of opposing faces of a horseshoe-type iron core between which the gap is established.

For fabrication of this type of composite substrate 310, the soft magnetic portions 112, 112' are bonded to the non-magnetic portion 111 at opposite sides thereof. The grooves 15, 16 are, respectively, formed in the sheets 112, 112'. Thereafter, the transverse groove 17 is formed along the width of the composite substrate 310 at right angles to the grooves 15, 16 as shown. The U-shaped portion of the optical fiber F is set in position in the grooves 15, 16 and 17 and bonded to the grooves in the same manner as in the foregoing embodiments. Subsequently, the non-magnetic portion 111 is grooved as indicated to form grooves 12, 13 and 14, each to a depth where the optical fiber has been set in position. More particularly, although the depth depends on the diameter of the bare optical fiber U, it should be greater than the diameter of the bare optical fiber 11, thereby completely cutting and removing the optical fiber at the respective grooves.

Figure 5:
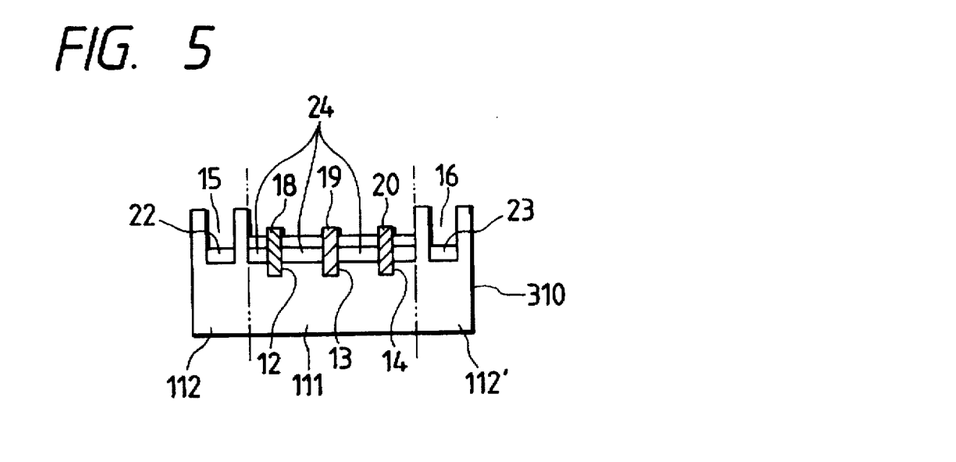
FIG. 5 is a side view of the sensor of FIG. 4 as viewed from the side of the beam input and output optical fibers.

FIG. 5 shows the substrate 310 after insertion of the optical modulation unit as viewed from beam output and input sides.

In the figure, it will be seen that the central non-magnetic portion 111 is integrally bonded with the soft magnetic portions 112, 112' at opposite sides thereof to provide the composite substrate 310. The polarizer 18, magnetooptical element 19 and analyzer 20 are inserted into the grooves 12, 13 and 14, respectively. Optical fibers 24 are left between adjacent optical elements 18, 19 and 20, thereby forming a light path. In FIG. 5, the bare optical fiber 22 at the beam input side and the bare optical fiber 23 at the beam output side are, respectively, shown as not jacketed in the grooves 15, 16. In this connection, the optical fibers 22, 23 may be fixed in the groove entrance regions of the grooves 22, 23 as jacketed. This is advantageous in that the optical fiber is unlikely to break at the groove entrances.

In FIG. 5, the polarizer 18, magnetooptical crystal element 19 and analyzer 20 are, respectively, disposed in the grooves 12, 13 and 14 so as to be higher than the depths of the individual grooves. This is for the following reason. When these optical elements are inserted into the respective grooves, they have to be carefully set so that the setting directions thereof are not in error. Nevertheless, the optical elements are very fine in size. If an error in the direction occurs, elements set higher than the grooves can be readily detached. Of course, the grooves 12, 13 and 14 may be so formed as to have a depth greater than the heights of individual optical elements.

Figure 6:
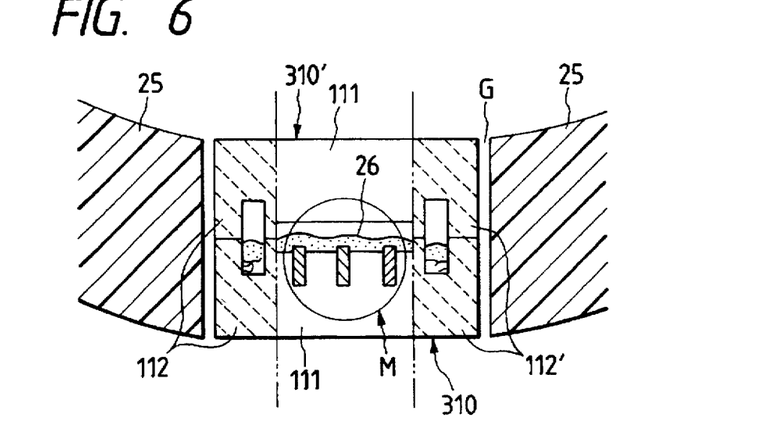
FIG. 6 is a schematic perspective view of an optical fiber sensor according to a further embodiment of the invention as placed in a gap of a horseshoe-shaped iron core.

FIG. 6 shows another embodiment of an optical fiber sensor which has the substrate 310 as shown in FIGS. 4 and 5. In this embodiment, another composite substrate 310' is mounted on the substrate 310 having the optical fiber F and the optical modulation unit M therein. The substrate 310' has neither any optical fiber F nor optical modulation unit M but has a non-magnetic portion 111 and soft magnetic portions 112, 112' bonded to the non-magnetic portion 111 at opposite sides thereof, like the substrate 310. The soft magnetic portions 112, 112' of the composite substrate 310' are, respectively, bonded to the portions 112, 112' of the composite substrate 310 in a manner as shown hereinbefore. The total thickness of the soft magnetic portions of the composite substrates 310, 310' is so controlled as to substantially coincide with the thickness of a horseshoe-type iron core 25 at a gap. Although not shown in FIG. 6, the width of the sensor having the combination of the substrates 310, 310' should preferably be substantially coincident with that of the iron core 25. In this arrangement, the gap G of the iron core 25 is substantially entirely filled with the soft magnetic portions 112, 112'. Although the superposition of the substrate 310' having the non-magnetic portion 111 on the substrate 310 has been set out above, soft magnetic pieces alone may be mounted on the corresponding soft magnetic portion portions 112, 112' of the composite substrate 310, with similar results.

By the arrangement set out above, leakage of the magnetic field generated in the gap G of the iron core 25 can be prevented and the magnetic field may be concentrated at the optical modulation unit M. In FIG. 6, although a bonding agent 26 is shown as being built up, the substrate 310' can be superposed without any influence of the built-up agent 26.

Figure 7:
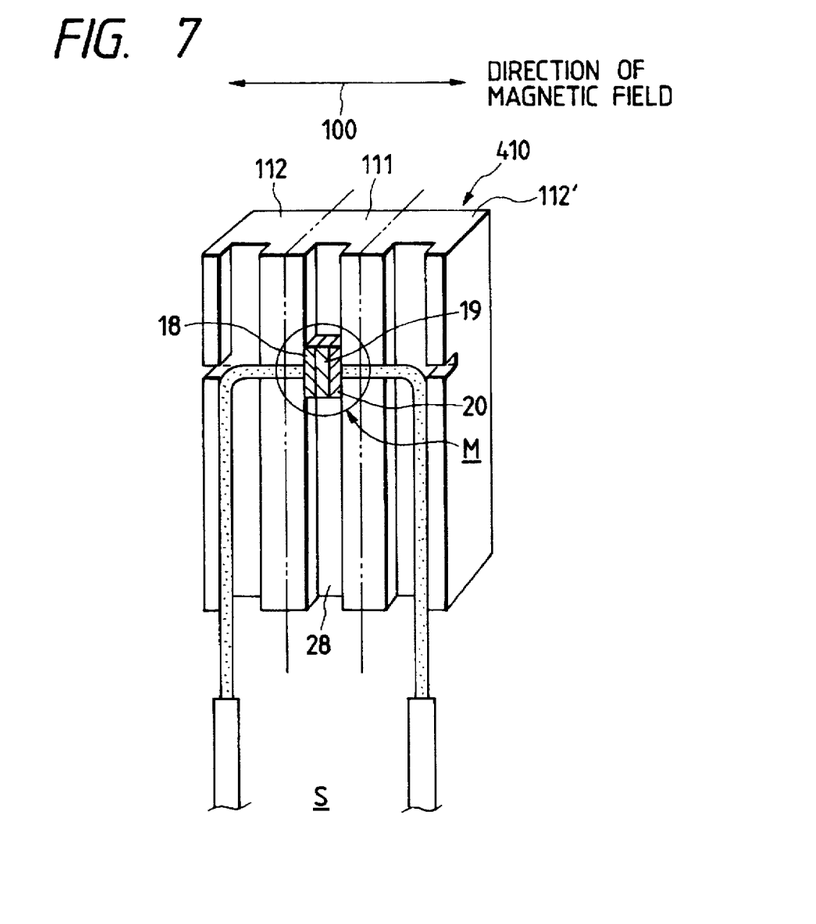
FIG. 7 is a schematic perspective view of an optical fiber sensor according to another embodiment of the invention.

FIG. 7 shows yet another embodiment of an optical fiber sensor according to the invention. In this embodiment, a composite substrate 410 is composed of a central non-magnetic portion 111 and soft magnetic portions 112, 112' bonded with the non-magnetic portion 111 at opposite sides thereof.

In this case, a polarizer 18, an optical modulation element 19 made of a garnet crystal, and an analyzer 20 sequentially arranged in this order as in the forgoing embodiments are integrally bonded together by means of such bonding agents as set out hereinbefore, thereby forming a integrally combined optical modulation unit M. This integrally combined unit M is inserted into and fixed in a groove 28.

Most commercially available glass analyzed and polarized have, respectively, 0.2 mm in thickness. When these non-magnetic portions are bonded together for use as the polarizer 18 and the analyzer 20, the total thickness becomes 0.4 mm. The optical modulation element 19 such as a garnet crystal has to be sandwiched between the polarizer 18 and the analyzer 20, such that the integrally combined unit M has a thickness of approximately 1 mm. When a garnet substrate on which a garnet crystal 19 is epitaxially grown is polished, the total thickness of the optical modulation unit M can be further reduced.

In this embodiment, only one longitudinal groove 28 which is slightly wider than the thickness of the integrally combined modulation unit M is formed in the central non-magnetic portion 111. Accordingly, the non-magnetic portion 111 can be designed to have a width of approximately 2 mm. Thus, the gap distance in the horseshoe-type iron core can actually be produced by the bonding of the soft magnetic portions 112, 112' at opposite sides of the non-magnetic portion 111. The formation of only one groove 28 in the non-magnetic portion 111 is more efficient and simpler. In addition, the optical modulation unit M can be readily obtained by bonding elongated optical parts together and cutting them into pieces with a desired size.

Figure 8:
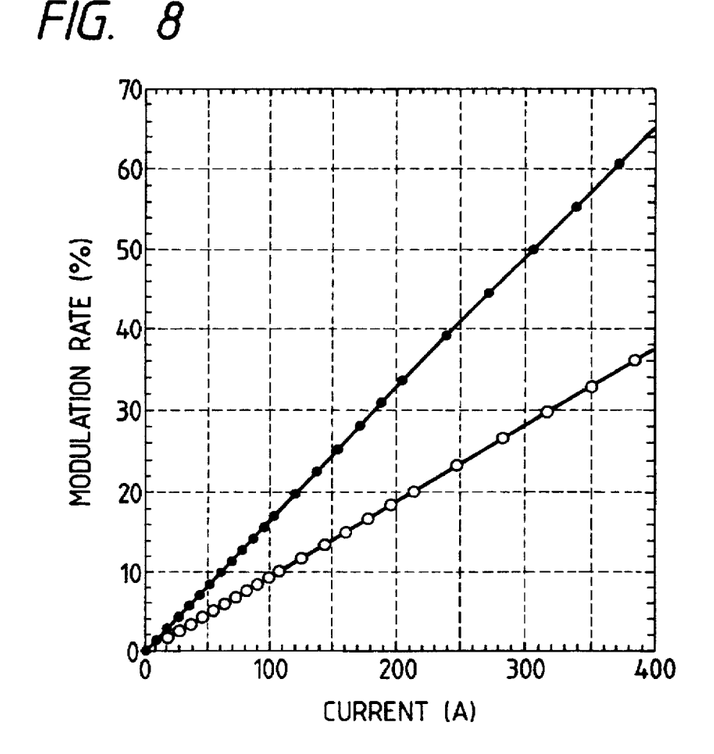
FIG. 8 is a graph showing the relation between the modulation rate and the electric current for one sensor in accordance with the present invention and another sensor in accordance with the present invention.

FIG. 8 shows the relation between the modulation ratio and the electric current passing through an electric wire in a horseshoe-type iron core of the type shown in FIG. 9 for the sensor of the invention using ferrite sheets and a sensor for comparison as shown in FIG. 1 which makes use of a glass substrate alone. The sensor comprising the ferrite sheets is of the type shown in FIG. 2.

The gap distance in the horseshoe-type iron core is set at 26 cm, and an electric wire is provided substantially at the center of the core.

The sensor which has a width of a glass substrate of 20 cm, is inserted into the gap of the iron core, followed by the passage of different electric currents to detect a modulation signal.

Likewise, the sensor of FIG. 2, which has a width of a glass portion of 8 mm and a width of each ferrite portion of 6 cm, with a total thickness corresponding to the width of the glass substrate sensor, is inserted into the gap and subjected to measurement of the modulation signal.

The results are shown in FIG. 8, wherein the line obtained by plotting solid circles is for the sensor of FIG. 2 and the line obtained by plotting circles is for the glass substrate sensor of FIG. 1 for comparison.

With the sensor for comparison, the modulation rate is about 18% at an electric current of 200 A. On the other hand, with the sensor of FIG. 2 which has a substrate made of the glass portion and ferrite portions bonded at opposite sides thereof, the modulation ratio is about 33% at 200 A. Thus, the sensitivity of the sensor of FIG. 2 is about two times that of the comparison sensor of FIG. 1.

Moreover, when the above procedure is repeated using an optical fiber sensor of the type shown in FIG. 7, which has a glass portion of 2 mm in width and each ferrite portion of 9 mm in width, the modulation ratio reaches 56% at an electric currant of 200 A. The sensitivity of this sensor is three times greater than that of the comparative sensor.

In the fabrication of the sensors according to the foregoing 10 embodiments of the invention, it is efficient from the standpoint of productivity to initially provide an, elongated non-magnetic portion and elongated soft magnetic sheets. Then, these sheets are bonded together and grooved in a manner as having been set out hereinbefore, followed by cutting the sheets into unit pieces having a desired length. Accordingly, a number of substrates can be efficiently made. Subsequently, a shaped optical fiber is set and fixed in the grooves of the thus made substrate unit and an optical modulation unit is also set and fixed in a light path of the optical fiber.

Alternatively, elongated non-magnetic and soft magnetic sheets may be bonded together with a length corresponding to that necessary for two sensors, followed by forming two grooves along the length thereof and two transverse grooves in such a way that two shaped optical fibers are set and forced in the respective groove patterns each made of the two lengthwise grooves and one transverse groove. In order to set an optical modulation unit in a light path of the optical fiber, at least one groove is formed in parallel to the lengthwise grooves and set with the optical modulation unit in position. Thus, two sensors can be fabricated at one time, with good productivity.

In the foregoing embodiments, the ferrites are mentioned as the soft magnetic material. It is known that the magnetic permeability of ferrites vary depending on the ambient temperature. The magnetic permeability also varies, more or less, depending on the type, shape and dimension of ferrite. In the practice of the invention, it may be possible to use an optical modulation element made of a garnet crystal whose temperature characteristics of sensitivity is inconsistent with the temperature dependence of permeability of the permeability of the ferrite used.

The magnetic permeability of ferrites increases at higher temperatures. To compensate for the increase of the magnetic permeability due to the influence of a rise in temperature, the garnet crystal used should conveniently be made, for example, of $Bi_{1.1}Gd_{0.85}Y_{1.05}Fe_{4.5}Ga_{0.05}O_{12}$ which has reduced sensitivity when the temperature increases. In this way, the resultant optical fiber sensor becomes stable with respect to the change of the ambient temperature.

In the practice of the invention, it is preferred to use a ferrite both for a soft magnetic portion of a composite substrate and for a horseshoetype iron core. However, another type of soft magnetic material be used as the soft magnetic portion without causing any lowering of sensitivity. For instance, silicon steels may be used for this purpose. In view of the cost and performance of optical fiber sensors, the iron core may be made of a soft magnetic material other than ferrites, e.g. silicon steels. When different types of soft magnetic materials are used for the composite substrate and the iron core and a garnet crystal is used to compensate for a variation in magnetic permeability due to the temperature, care should be taken as to which of the material, used for the composite substrate or the core is more influenced by the variation.

Moreover, according to the invention, a non-magnetic portion and soft magnetic portions are bonded together by means of a bonding agent. If the resultant composite substrate is not satisfactory with respect to the mechanical strength thereof, a reinforcing sheet made, for example, of a synthetic resin may be attached to a side of the optical fiber sensor which is opposite to a side on which the optical modulation unit has been formed.

What is claimed is:

1. An optical fiber sensor which comprises:
   a substrate having a pair of elongated grooves kept away from and in parallel with each other and formed along the length of the substrate, and a third groove intersected at right angles with the paired grooves, respectively;
   an optical fiber having a U-shaped portion which is inserted into and fixed in a groove pattern formed by said paired grooves and said third groove; and
   an optical modulation unit which is fixedly provided in a light path of said optical fiber placed in the third groove, wherein the substrate is composed of a composite substrate which comprises a non-magnetic portion and soft magnetic portions fixed to the non-magnetic portion at opposite sides thereof, said paired elongated grooves are, respectively, formed in said soft magnetic portions, and said optical modulation unit is fixed to said non-magnetic portion.

2. An optical fiber sensor according to claim 1, wherein said optical modulation unit includes a polarizer, a magnetooptical element and an analyzer sequentially arranged in this order in the optical path wherein said polarizer, said magnetooptical element and said analyzer are, respectively, disposed and fixed in grooves formed in said non-magnetic portion at intervals therebetween.

3. An optical fiber sensor according to claim 2, wherein said polarizer, said magnetooptical element and said analyzer are, respectively, designed to be higher than the depth of the respective grooves.

4. An optical fiber sensor according to claim 2, wherein said magnetooptical element is disposed and fixed in a groove formed in said non-magnetic portion and said polarizer and said analyzer are, respectively, disposed and fixed in grooves which are formed in said soft magnetic portions, respectively.

5. An optical fiber sensor according to claim 2, wherein said polarizer, said magnetooptical element and said analyzer are fixedly bonded together to provide an integrally bonded optical modulation unit in the optical path whereby said non-magnetic portion is made narrow sufficient to receive said integrally bonded optical modulation unit.

6. An optical fiber sensor according to claim 1, further comprising another composite substrate which has a non-magnetic portion and soft magnetic portions fixed to said non-magnetic portion at opposite sides thereof and which has a similar construction as the first mentioned composite substrate wherein said another composite substrate is fixed to said first-mentioned composite substrate so that the soft magnetic portions are facing each other.

7. An optical fiber sensor according to claim 6, wherein said soft magnetic portions of said another composite substrate are higher than said non-magnetic portion whereby said another composite substrate is recessed at said non-magnetic portion.

8. An optical fiber sensor according to claim 1, wherein said soft magnetic portions, respectively, have a thickness equal to said non-magnetic portion.

9. An optical fiber sensor according to claim 1, wherein said soft magnetic portions, respectively, have a thickness greater than said non-magnetic portion.

10. An optical fiber sensor according to claim 1, wherein said non-magnetic portion consists of glass or a ceramic, and said soft magnetic portion consists of a ferrite.

11. An optical fiber sensor according to claim 1, wherein said U-shaped portion have two bent portions which have, respectively a radius of curvature of from 0.3 to 5 mm.

12. An optical fiber sensor according to claim 1, further comprising a pair of soft magnetic pieces mounted on and fixed to said soft magnetic portions, respectively.

13. A method for making an optical fiber sensor comprising the steps of:
   forming a substrate having a pair of elongated grooves kept away from and in parallel to each other and formed along the length of the substrate, and a third groove intersected at right angles with the paired grooves, respectively;
   inserting an optical fiber having a U-shaped portion into and fixing the optical fiber in a groove pattern formed by said paired grooves and said third groove; and
   inserting an optical modulation unit in the third groove so as to be in a light path of said optical fiber and fixing the optical modulation unit in the third groove;
   wherein said substrate is formed by bonding soft magnetic portions to a non-magnetic portion at opposite sides thereof by means of a bonding agent, thereby forming a composite substrate.

14. A method according to claim 13, further comprising the step of forming the pair of elongated grooves in said soft magnetic portions, respectively, after the bonding.

15. A method according to claim 13, wherein said bonding agent consists of an organic bonding agent.

16. A method according to claim 13, wherein said bonding agent consists of an inorganic agent and is fired after bonding.

17. An optical fiber sensor comprising:
- a composite substrate having a non-magnetic portion and a magnetic portion attached to a side of the non-magnetic portion;
- an optical modulation unit having an optical element attached to said composite substrate; and
- an optical fiber attached to said composite substrate so as to direct light along a path towards said optical modulation unit wherein:
    - said composite substrate includes a first groove and a second groove; and
    - said optical fiber is disposed in said first groove and said optical element is disposed in said second groove.

18. An optical fiber sensor according to claim 17, wherein the modulation unit is mirrorless, and the modulation unit and optical fiber are fixedly attached to said composite substrate.

19. An optical fiber sensor according to claim 17, wherein said first groove is substantially perpendicular to said second groove.

20. An optical fiber sensor according to claim 17, wherein:
- said magnetic portion is a first soft magnetic portion; and
- said composite substrate includes a second soft magnetic portion attached to an opposed side of said the non-magnetic portion.

21. An optical fiber sensor according to claim 17, wherein said optical fiber includes a curved portion.

* * * * *